United States Patent
Buckmueller

(10) Patent No.: US 11,563,355 B2
(45) Date of Patent: Jan. 24, 2023

(54) ELECTRONICS OF AN ELECTRIC MOTOR OF A MOTOR VEHICLE

(71) Applicant: Brose Fahrzeugteile GmbH & Co. Kommanditgesellschaft, Bamberg, Bamberg (DE)

(72) Inventor: Peter Buckmueller, Bamberg (DE)

(73) Assignee: Brose Fahrzeugteile GmbH & Co. Kommanditgesellschaft, Bamberg, Bamberg (DE)

(*) Notice: Subject to any disclaimer, the term of this patent is extended or adjusted under 35 U.S.C. 154(b) by 771 days.

(21) Appl. No.: 16/548,358

(22) Filed: Aug. 22, 2019

(65) Prior Publication Data
US 2020/0067377 A1 Feb. 27, 2020

(30) Foreign Application Priority Data
Aug. 23, 2018 (DE) .................... 10 2018 214 228.9

(51) Int. Cl.
*H02K 5/22* (2006.01)
*H02K 11/30* (2016.01)
*H01R 13/66* (2006.01)
*H05K 5/00* (2006.01)
*H05K 1/18* (2006.01)
*H01R 43/20* (2006.01)
*H02K 7/00* (2006.01)
*H02K 9/22* (2006.01)

(52) U.S. Cl.
CPC .......... *H02K 5/225* (2013.01); *H01R 13/6625* (2013.01); *H01R 13/6633* (2013.01); *H01R 43/205* (2013.01); *H02K 7/006* (2013.01); *H02K 9/227* (2021.01); *H02K 11/30* (2016.01); *H05K 1/18* (2013.01); *H05K 5/0069* (2013.01); *H01R 2201/10* (2013.01); *H02K 2211/03* (2013.01); *H05K 2201/1003* (2013.01); *H05K 2201/1009* (2013.01); *H05K 2201/10015* (2013.01); *H05K 2201/10189* (2013.01); *H05K 2201/10325* (2013.01); *H05K 2201/10939* (2013.01)

(58) Field of Classification Search
CPC ........ H02K 5/225; H02K 11/30; H02K 9/227; H01R 13/6625; H01R 13/6633
USPC .......................................................... 310/64
See application file for complete search history.

(56) References Cited

U.S. PATENT DOCUMENTS 6,316,822 B1 * 11/2001 Venkateshwaran .......................... H01L 23/49575
257/676
9,917,406 B1 * 3/2018 Iwasaki ................ H01R 12/737
10,283,896 B1 * 5/2019 Hennon ............... H01R 13/052
(Continued)

FOREIGN PATENT DOCUMENTS

CN 107112851 A 8/2017
CN 107404196 A 11/2017
(Continued)

Primary Examiner — Alexander Gilman
(74) Attorney, Agent, or Firm — Brooks Kushman, P.C.

(57) ABSTRACT

The disclosure relates to electronics of an electric motor of a motor vehicle, having a connection unit that is placed in electrical contact with a circuit board and attached thereto. The connection unit has a number of leadframes that are stabilized with respect to one another. The connection unit at least partly forms a connector socket for a mating connector, and the connection unit at least partly forms a contact point for an electromagnet of the electric motor.

19 Claims, 3 Drawing Sheets

(56) References Cited

U.S. PATENT DOCUMENTS

| | | | |
|---|---|---|---|
| 2004/0196607 A1* | 10/2004 | Didier | H01R 13/68 361/104 |
| 2008/0078631 A1* | 4/2008 | Erlston | H02K 1/141 188/159 |
| 2008/0153325 A1* | 6/2008 | Boileau | H01R 9/226 439/75 |
| 2012/0256239 A1* | 10/2012 | Herbsommer | H01L 24/20 257/288 |
| 2013/0025745 A1* | 1/2013 | Abbott | C23C 18/1633 148/277 |
| 2015/0194752 A1* | 7/2015 | Vino, IV | H01R 12/585 29/874 |
| 2015/0262903 A1* | 9/2015 | Lohia | H01L 24/97 257/676 |
| 2015/0280380 A1* | 10/2015 | Jeon | H01R 43/24 439/682 |
| 2015/0333420 A1* | 11/2015 | Davis | H01R 13/6587 439/712 |
| 2016/0190728 A1* | 6/2016 | VanZuilen | H01R 13/5202 310/71 |
| 2016/0204052 A1* | 7/2016 | Fen | H01L 24/83 257/676 |
| 2016/0300784 A1* | 10/2016 | Eugene Lee et al. | H01L 23/49537 |
| 2017/0020011 A1* | 1/2017 | Fantin | G07C 5/02 |
| 2017/0125324 A1* | 5/2017 | Joshi | H01L 23/49537 |
| 2017/0149300 A1* | 5/2017 | Bourqui | H01R 12/75 |
| 2017/0179007 A1* | 6/2017 | Chang | H01L 23/49503 |
| 2020/0059020 A1* | 2/2020 | Hammerschmied | H01R 24/66 |
| 2020/0067377 A1* | 2/2020 | Buckmueller | H01R 13/6633 |
| 2020/0120837 A1* | 4/2020 | Hustedt | H01L 23/473 |
| 2020/0359462 A1* | 11/2020 | Zimmerman, III | F21V 23/0464 |
| 2021/0190918 A1* | 6/2021 | Li | G01S 7/4813 |
| 2021/0218312 A1* | 7/2021 | Motoda | H01R 4/5075 |
| 2021/0221426 A1* | 7/2021 | Kanno | B62D 5/0406 |
| 2021/0234304 A1* | 7/2021 | Zebhauser | H01R 13/645 |
| 2021/0265763 A1* | 8/2021 | Zebhauser | H01R 13/518 |
| 2022/0037845 A1* | 2/2022 | Zebhauser | H01R 24/547 |
| 2022/0123505 A1* | 4/2022 | Munch | H01R 13/6273 |

FOREIGN PATENT DOCUMENTS

| | | |
|---|---|---|
| DE | 10161366 A1 | 6/2003 |
| DE | 202005010252 U1 | 12/2006 |
| DE | 202015105246 U1 | 2/2017 |
| DE | 102015217020 A1 | 3/2017 |

* cited by examiner

ELECTRONICS OF AN ELECTRIC MOTOR OF A MOTOR VEHICLE

CROSS-REFERENCE TO RELATED APPLICATIONS

This application claims priority to German Patent Application No. DE 10 2018 214 228.9 filed Aug. 23, 2018, the disclosure of which is incorporated in its entirety by reference herein.

TECHNICAL FIELD

The disclosure relates to electronics of an electric motor of a motor vehicle. The disclosure furthermore relates to an electric motor of a motor vehicle and to a method for manufacturing electronics. The electric motor expediently has a brushless design, and the electronics are in particular tailored thereto.

BACKGROUND

Motor vehicles usually have a multiplicity of auxiliary units, which are designed for example as an adjustment drive. These serve primarily not just to propel the motor vehicle, but rather, for example to influence further functions of the motor vehicle. They may serve to increase convenience. Thus, in particular, a window lifter and/or a convertible top are mostly designed so as to be electric, and a transmission is also operated automatically.

To this end, the auxiliary units usually have an electric motor, which has for example a brushless design. Wear may thereby be reduced. The electric motor itself normally has a number of electromagnets, by way of which a rotating magnetic field is created during operation. However, at least the magnetic field is temporally changeable. For this purpose, or at least for setting a speed of the electric motor, the electric motor may include electronics by way of which the electromagnets are suitably energized. In particular, an intensity of the energization is changed and/or the energization is subjected to a temporal change.

The electronics are mostly arranged in an electronics compartment that may be attached to further components of the electric motor, in particular a housing. It is thus necessary to provide a separate electronics housing with the electronics compartment, which increases installation space and manufacturing costs. One alternative to this is to encapsulate a circuit board providing the respective electrical circuit with a thermoset. The electronics are protected by way of the thermoset, as a result of which the electronics housing is able to be dispensed with. Electrical contact may be made with the circuit board by way of a leadframe that is routed out of the thermoset.

Due to the comparatively low viscosity of the thermoset, however, it is possible for the leadframe not to be completely covered in the desired regions, as a result of which electrical isolation is not completely achieved. If this is intended to be prevented, it is possible for the thermoset also to cover further components of the leadframe that serve for making electrical contact. Electrical contact in particular with a line or the like is thus made more difficult or completely prevented. As a result of this, comparatively expensive post-processing is necessary, or there may be an increase in rejects. It is also only possible to arrange the leadframe in a parting plane of a mold for the thermoset. Assembly expenditure in the motor vehicle is therefore increased, and the electronics are not able to be tailored as desired to further requirements or installation spaces.

The disclosure is based on the object of specifying particularly suitable electronics of an electric motor of a motor vehicle and a particularly suitable electric motor of a motor vehicle and also a particularly suitable method for manufacturing electronics of a motor vehicle, wherein in particular assembly is simplified, wherein adaptability is expediently increased, and wherein an installation size may be reduced.

With regard to the electronics, this object may be achieved according to the disclosure disclosed below. With respect to the electric motor, this object may be achieved according to the additional disclosure below. Advantageous developments and configurations are also disclosed below.

The electronics are a component of an electric motor of a motor vehicle. The electric motor is for example a component of an auxiliary unit of the motor vehicle. By way of example, the auxiliary unit is a pump, in particular a water pump or oil pump, such as a lubricant pump. In an alternative to this, the auxiliary unit is an adjustment drive, such as a steering assistance system, which may be a power steering system, a window lifter or an electric seat adjuster. In a further alternative, the auxiliary unit is for example an electromotive refrigerant compressor.

The electric motor is for example a commutator motor with brushes. Particularly, however, the electric motor may have a brushless design and is suitably a brushless DC-current motor (BLDC). The electric motor may be an asynchronous motor or a synchronous motor. The electronics may energize an electromagnet of the electric motor, in particular all of the electromagnets of the electric motor. A speed and/or a torque of the electric motor may be controlled and/or regulated by way of the electronics.

In the assembled state, the electronics are suitably placed in electrical contact with an on-board power system of the motor vehicle and are energized thereby. The electronics are in particular suitable for this purpose. By way of example, the on-board power system of the motor vehicle is a low-voltage on-board power system and channels for example an electric voltage of 12 volts, 24 volts or 48 volts. By way of example, in the installed state, the electronics are coupled in terms of signaling to a BUS system, in particular a LIN bus or CAN bus.

The electronics have a circuit board that is produced for example from a fiberglass-reinforced epoxy resin, on or in which circuit board a number of conductor tracks is arranged. The conductor tracks are expediently produced from a copper, in particular by way of etching. A number of electrical and/or electronic components may be attached to the circuit board and suitably placed in electrical contact with one another by way of the conductor tracks. An electrical circuit may be produced by way of the circuit board and the electrical/electronic components.

The electronics additionally have a connection unit that is placed in electrical contact with the circuit board and attached thereto. The connection unit is in particular placed in electrical contact with at least one of any conductor tracks of the circuit board. The connection unit may be expediently arranged substantially parallel to the circuit board. The connection unit may be a component that is separate from the circuit board and that is attached to said circuit board during manufacture. The connection unit has a number of leadframes that are stabilized with respect to one another. In this case, the individual leadframes are for example placed in electrical contact with one another or particularly may be electrically isolated from one another, as a result of which it is made possible to channel different electrical potentials by way of the individual leadframes. Due to the stabilization with respect to one another, the position of the individual leadframes with respect to one another is in this case predefined, which simplifies assembly on the circuit board. The connection unit is in particular formed by way of the leadframes that are stabilized with respect to one another.

The connection unit at least partly forms a connector socket. The connector socket is in particular formed completely by way of the connection unit. For example, the connector socket has the free end of one of the leadframes, in particular some of the leadframes, for example all of the leadframes. The leadframes may have a pin-shaped or jack-shaped design in the region of the connector socket. The connector socket serves to receive a mating connector, which is provided in particular by way of a line. The line is for example a component of an on-board power system and/or of a bus system of the motor vehicle. The mating connector is in particular predefined by a manufacturer of the motor vehicle.

The connection unit furthermore at least partly forms a contact point for an electromagnet of the electric motor. The connection unit in particular completely forms the contact point for the electromagnet of the electric motor. For this purpose, the contact point may have a number of contacts. The contact point is expediently designed for all of the electromagnets of the electric motor. A free end of at least one of the leadframes, may be a plurality of the leadframes, may be designed accordingly, and has for example an insulation displacement contact or at least one receptacle for a phase of the electric motor at its end. The contact may be formed by the leadframe. In summary, the contact point forms a phase contact for the electric motor. The electromagnet is expediently a component of an (electrical) phase of the electric motor, and the contact point thus serves in particular for making contact with the phase of the electric motor. For example, the electric motor has a plurality of such phases that are expediently placed in contact with one another in a delta or star connection. All of the phases of the electric motor in the assembled state may be placed in electrical contact with the contact point.

Due to the use of the connection unit, it is possible to adapt the connector socket to different mating connectors, whereas the circuit board does not have to be changed. Adjustability to different motor vehicles, in particular types of motor vehicle, is thus increased. It is also possible to electrically supply any electric current substantially by way of the leadframes of the connection unit, whereas channeling over the circuit board is able to be stopped. It is thus made possible to use a comparatively inexpensive circuit board, which reduces manufacturing costs. A structural size is also thereby reduced. Since the individual leadframes are stabilized with respect to one another, assembly on the circuit board is simplified. Since the contact point for the electromagnet is formed at least partly by way of the connection unit, it is possible to energize different types of electric motor with a particular type of circuit board, as a result of which it is possible to use a comparatively high number of common parts. Manufacturing costs are thus further reduced. In summary, the connector socket and/or the contact point are in particular able to be adapted to external conditions and/or wishes comparatively easily. It is additionally possible to guide an electric current via the leadframes of the connection unit.

By way of example, the connector socket and the contact point have the same orientation. Electrical contact is thus made with the contact point and the connector socket from the same direction. The connector socket and the contact point may be differently from one another, for example by 90°. Electrical contact is thus made with the connector socket and the contact point from different directions, which simplifies assembly and makes comparatively efficient use of an installation space.

By way of example, the connector socket and the contact point are electrically isolated from one another, and a flow of current is made possible only via the circuit board. A flow of current between the contact point and the connector socket and vice versa is thus able to be set in particular by way of the circuit board. One of the leadframes of the connection unit may form both part of the connector socket and part of the contact point. In other words, at least part of the connector socket and at least part of the contact point are formed with a common one of the leadframes. Current is thus able to be channeled directly between the contact point and the connector socket. In this case, a comparatively high electrical potential and/or a comparatively large electric current are in particular channeled directly by way of the common leadframe during operation. It is thus possible to produce the circuit board comparatively inexpensively. By way of example, the common leadframe, in the assembled state, is placed in contact with electrical ground, in particular the body of the motor vehicle. In other words, ground is provided by way of the common leadframe.

The leadframes may be at least partly encapsulated with a thermoplastic. The leadframes are expediently stabilized with respect to one another by way of the thermoplastic. The leadframes may be electrically isolated from one another and/or from further components by way of the thermoplastic. For manufacturing purposes, the leadframes are first of all in particular suitably arranged in a mold and encapsulated with the thermoplastic in a subsequent working step. The encapsulation may be produced in a plastics injection molding process. Destruction-free removal of the leadframes is in particular prevented due to the encapsulation, which increases robustness. Due to the use of the thermoplastic, a comparatively precise delimitation of the connector socket and/or of the contact point is made possible. The contact point and/or the connector socket may be free from the thermoplastic, as a result of which making electrical contact becomes easier. An enclosure of the connector socket may be provided by way of the thermoplastic, as a result of which, in the assembled state, the mating connector is stabilized by way of the enclosure. Robustness is thus increased.

SUMMARY

As an alternative or in combination therewith, the circuit board and the connection unit are expediently covered with a thermoset. In this case, the circuit board may be completely covered with the thermoset, and the connection unit may be at least partly covered with the thermoset. The connector socket is suitably at least partly or completely free from the thermoset and/or the contact point is at least partly or may be completely free from the thermoset. The circuit board and/or the connection unit are in particular electrically isolated from other components of the motor vehicle by way of the thermoset, which increases safety.

Due to the covering, the circuit board and at least partly the connection unit are protected from any damage, and an electrical short circuit is also prevented. It is thus possible to dispense with a housing, which reduces manufacturing costs and weight. Installation space is also thereby reduced. The electronics are in particular designed without a housing.

The connector socket and the contact point are suitably free from the thermoset, as a result of which making electrical contact with the electronics becomes easier. The leadframes may be at least partly encapsulated with the thermoplastic. In this case, the thermoset reaches in particular as far as the edge of the thermoplastic, by way of which in particular the edge of the thermoset is defined in the region of the connector socket and/or the contact point. If the thermoset does not reach as far as the edge due to production tolerances, electrical isolation is however still present due to the thermoplastic. A comparatively high temperature resistance of the covering is achieved due to the use of the thermoset, as a result of which the electronics are also able to be used in comparatively hot environments. In this case, the position of the thermoplastic is stabilized by way of the thermoset.

The electronics suitably have a heat sink that is placed in thermal contact with the circuit board. The heat sink in particular bears mechanically on the circuit board directly or via a thermal conductor, such as a thermally conductive pad, a crosslinking thermally conductive mass or a thermally conductive gel. The crosslinking thermally conductive mass is for example a gap filler, that is to say a silicone containing ceramic fillers. The heat sink is for example manufactured from an aluminum and/or has a number of cooling fins. By way of example, the heat sink is designed passively. As an alternative thereto, a fluid flow is created over any cooling fins. In other words, the heat sink may be an active heat sink. By way of example, it is fluid air or a liquid, such as water or an oil. Due to the heat sink, a service life is increased and use in comparatively hot environments is also made possible. If the covering is present, the heat sink expediently protrudes therefrom, as a result of which heat dissipation is improved. As an alternative thereto, the heat sink is at least partly, for example completely, covered with the thermoset.

By way of example, the connection unit is placed loosely on the circuit board and is expediently stabilized there by way of the covering. The connection unit may be soldered to the circuit board. In this case, at least one of the leadframes is soldered to one of any conductor tracks of the circuit board, for example by way of a selective soldering process or of an SMD process. As an alternative or at least partly in combination therewith, the connection unit is pressed on the circuit board, in particular the leadframes of the circuit board. These are designed for example at least partly in the manner of a press fit or clamping contact and held by way of corresponding receptacles in the circuit board, in particular holes. Stability is increased due to the pressing, with assembly being simplified. The covering is expediently additionally present, as a result of which undesired detachment of the connection unit from the circuit board is prevented.

The connection unit may server to channel electric current. An electrical or electronic component may be placed in direct electrical contact with at least one of the leadframes. By way of example, the component is soldered to at least one of the leadframes. As an alternative thereto, the leadframe may have a clamping contact, which may be an insulation displacement contact, by way of which contact is made with the electrical/electronic component. The component may be placed in electrical contact with at least two of the leadframes, as a result of which the component is electrically connected between them. The component is for example an electric coil or an electrical capacitor. Due to the direct attachment of the component to the leadframe, an electrical function, for example smoothing of an electric current, is also provided by way of the connection unit. This current does not have to be channeled by way of the circuit board for this purpose, due to which said circuit board is able to be produced comparatively inexpensively. Comparatively efficient use is also thereby made of an installation space, since the component is attached to the leadframe, and space for further components is therefore provided on the circuit board.

The electric motor is a component of the motor vehicle and serves for example to propel the motor vehicle. The motor vehicle is in this case for example a hybrid motor vehicle or a completely electrically driven motor vehicle (electric vehicle). The electric motor may be a component of an auxiliary unit of the motor vehicle, expediently an adjustment drive of the motor vehicle. The electric motor itself has an electromagnet that is energized by way of electronics. The electronics have a connection unit that is placed in electrical contact with a circuit board and attached thereto. The connection unit has a number of leadframes that are stabilized with respect to one another, wherein the connection unit at least partly forms a connector socket for a mating connector, and wherein the connection unit at least partly forms a contact point for the electromagnet of the electric motor.

The electromagnet of the electric motor is placed in electrical contact with the contact point. The electromagnets are expediently energized by way of the electronics during operation. A current intensity is in particular set, for example controlled and/or regulated, by way of the electronics. The contact point expediently has clamping contacts, for example insulation displacement contacts, within which a terminal of the electromagnet is held in the assembled state. The electromagnet is in particular formed by way of an electric coil that is wound from a wire, expediently an enameled wire, such as a copper enameled wire or an aluminum enameled wire. The electric motor suitably has a plurality of such electromagnets, wherein all of the electromagnets are placed in electrical contact with the contact point of the electronics. The contact point in particular has a number of individual contacts corresponding to the number of electromagnets. The electric motor in particular comprises a number of phases, for example three phases, wherein each of the phases is assigned an identical number of the electromagnets.

The electric motor may have a brushless design, and the phases are expediently connected to one another in a delta or star connection. In one alternative, the electric motor is a commutator motor with brushes. The electronics may be designed without a housing and have the covering made from the thermoset. The electronics are expediently fastened to a housing of the electric motor that in particular incorporates any stator and/or rotor of the electric motor.

The method for manufacturing electronics of an electric motor of a motor vehicle, having a connection unit that is placed in electrical contact with a circuit board and attached thereto and that has a number of leadframes that are stabilized with respect to one another, wherein the connection unit at least partly forms a connector socket for a mating connector, and wherein the connection unit at least partly forms a contact point for an electromagnet of the electric motor, makes provision that, in one working step, a number of leadframes are stabilized with respect to one another such that the connection unit is provided that at least partly forms the connector socket for the mating connector and at least partly forms the contact point for the electromagnet of the electric motor. The individual leadframes are in particular encapsulated with a thermoplastic for this purpose.

In a further working step, the connection unit is placed in electrical contact with the circuit board and attached thereto. The connection unit is in this case may be soldered to the circuit board or pressed thereon. The circuit board may be already completely produced before this, and further electrical and/or electronic components are suitably soldered thereto, for example by way of an SMD process. In other words, the circuit board with the components attached thereto and/or further components and the connection unit are produced separately from one another and attached to one another only thereafter. After the attachment and creation of electrical contact, covering with the thermoset may be carried out, as a result of which stability is increased.

The developments and advantages explained in connection with the electronics may also be transferred analogously to the electric motor and/or the method for manufacturing the electronics, and vice versa.

BRIEF DESCRIPTION OF THE DRAWINGS

The disclosure is explained in more detail below with reference to a drawing. In the figures.

DETAILED DESCRIPTION

As required, detailed embodiments of the present disclosure are disclosed herein; however, it is to be understood that the disclosed embodiments are merely exemplary of the disclosure that may be embodied in various and alternative forms. The figures are not necessarily to scale; some features may be exaggerated or minimized to show details of particular components. Therefore, specific structural and functional details disclosed herein are not to be interpreted as limiting, but merely as a representative basis for teaching one skilled in the art to variously employ the present disclosure.

Parts that correspond to one another are denoted by the same reference signs throughout the figures.

Figure 1:
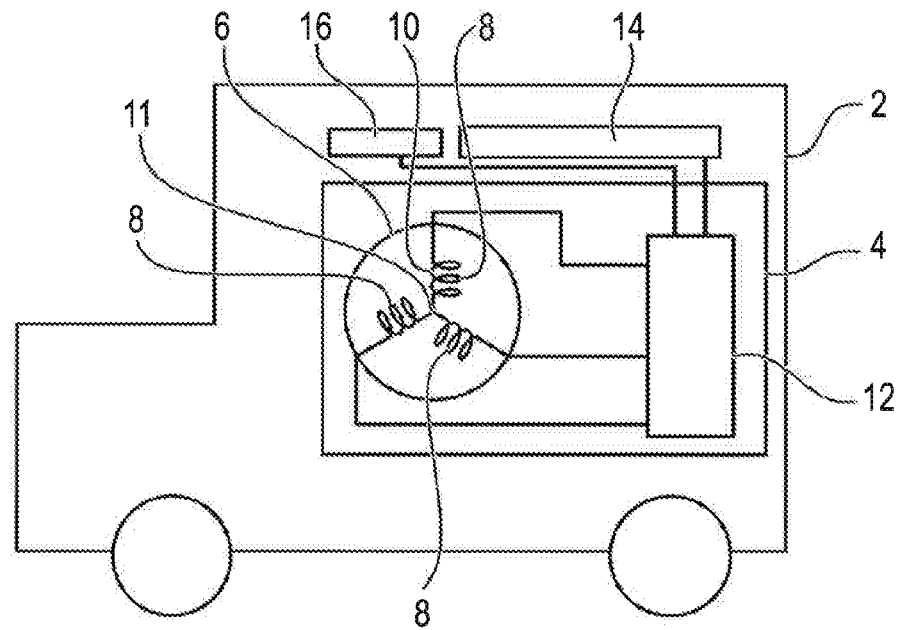
FIG. 1 schematically shows a motor vehicle having an electric motor that has a plurality of electromagnets that are energized by way of electronics, FIG. 2 schematically shows a sectional illustration of the electronics in a simplified manner.

FIG. 1 schematically shows, in a simplified manner, a motor vehicle 2 that comprises an electric motor 4. The electric motor 4 has a brushless design and has a stator 6 with a total of three electrical phases 8, which each have a certain number of electromagnets 10 in the form of electric coils. The electrical phases 8 are connected to form a delta connection, and therefore guided away from a common star point 11. The electrical phases 8 are furthermore placed in electrical contact with electronics 12. During operation, the electrical phases 8 and thus the electromagnets 10, by way of which a rotating magnetic field is created, are energized by way of the electronics 12. A permanently excited rotor is in this case moved by way of the rotating magnetic field. In summary, the electromagnets 10 of the electric motor 4 are energized by way of the electronics 12.

The motor vehicle 2 furthermore has an on-board power system 14, by way of which the electric motor 4, namely the electronics 12, is energized. The motor vehicle 2 also comprises an on-board computer 16, by way of which the electric motor 4 is controlled and/or regulated. In this case, certain commands are transmitted to the electronics 12, by way of which the individual electrical phases 8 and thus the electromagnets 10 are energized.

Figure 2:
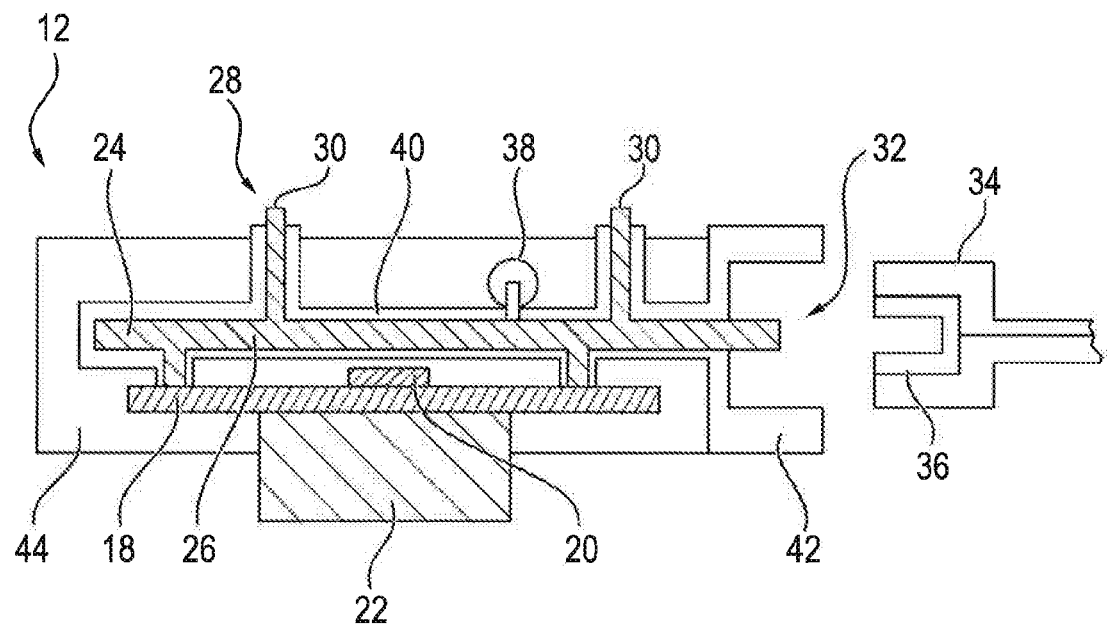

FIG. 2 schematically shows the electronics 12 in a sectional illustration in a simplified manner. The electronics 12 comprise a circuit board 18 that is produced from a fiberglass-reinforced epoxy resin, to which circuit board a number of conductor tracks made from a copper is attached. A number of electrical/electronic components 20 is soldered to the circuit board 18 in an SMD process, as a result of which an electrical circuit is created by way of the components 20 and the conductor tracks of the circuit board. A heat sink 22 bears flat against one side of the circuit board 18 and is placed in thermal contact with the circuit board 18. By way of example, a thermal conductor, not illustrated in more detail, such as a crosslinking thermally conductive mass, is arranged between the heat sink 22 and the circuit board 18 and simplifies a transfer of heat. The heat sink 22 is produced from an aluminum and has a number of cooling fins, not illustrated in more detail, that are spaced from the circuit board 18.

The electronics 12 furthermore have a connection unit 24 that comprises a number of leadframes 26. The leadframes 26 are electrically isolated from one another and each formed by way of a suitably stamped and possibly bent metal strip. The leadframes 26 are attached to the circuit board 18 on the side opposite the heat sink 22, that is to say on sides of the electrical/electronic component 20, and either soldered to or pressed on said circuit board. The connection unit 24 is thus soldered to or pressed on the circuit board 18, and the connection unit 24 is therefore stabilized with respect to the circuit board 18. In summary, the connection unit 24 is placed in electrical contact with the circuit board 18 and attached thereto.

A contact point 28 with a total of four contacts 30 is formed by way of the leadframes 26, and therefore also by way of the connection unit 24, two of which contacts are shown here. The contacts 30 are formed in the manner of an insulation displacement contact in each case by way of a suitable end of a respective leadframe 26, wherein the leadframes 26 respectively forming the contacts 30 are electrically isolated from one another. In the assembled state, in each case one of the electrical phases 8 and thus the electromagnets 10 are placed in electrical contact with three of the contacts 30, wherein the respective terminal of the electrical phases 8 is mechanically and electrically connected to the respectively assigned contact 30. The remaining contact 30 is placed in electrical contact with the star point 11. In summary, the connection unit 24 at least partly forms the contact point 28 for the electromagnets 10 of the electric motor.

A connector socket 32 is additionally formed by way of the connection unit 12. For this purpose, at least some of the leadframes 26 have a pin-shaped design at their end. The connector socket 32 serves to receive a mating connector 34 that forms an end of a line 36 that leads to the on-board power system 14 and the on-board computer 16. In this case, the mating connector 36 has a number of sleeve-shaped receptacles 36 that are placed over the pin-shaped sections of the connector socket 32 in the assembled state. One of the leadframes 26 in this case forms part of the connector socket 32 and part of the contact point 28, namely the contact 30, that is placed in electrical contact with the star point 11 in the assembled state. This leadframe 26 is connected to electrical ground of the line 36 in the assembled state. Electrical ground is thus not channeled via the circuit board 18, as a result of which comparatively large electric currents are also able to be dissipated to electrical ground from the star point 11 by way of the connection unit 24. This leadframe 26 is expediently likewise placed in electrical contact with the circuit board 18 and may likewise form the connection to ground there.

An electric coil 38 is connected between and placed in direct contact with two of the leadframes 26. The electric coil 38 is in this case placed in contact with and held by insulation displacement contacts, not illustrated in more detail, of the respective leadframes 26. The electric coil 38 is an electrical component, wherein, in an alternative embodiment, not illustrated in more detail, instead of the electric coil 38, a capacitor or an electronic component is placed in direct electrical contact with at least one of the leadframes 26. An electric current is smoothed in particular by way of the electric coil 38, as a result of which this acts like a choke. Installation space is not necessary on the circuit board 18 in this case, and the maximum electric current carried by way of the electrical component 38 may deviate from the maximum electric current able to be carried by the circuit board 18. In summary, the electric coil is placed in direct electrical contact with at least one of the leadframes 26.

The leadframes 26 are encapsulated with a thermoplastic 40 and thus stabilized with respect to one another. The leadframes 26 are also electrically isolated from one another by way of the thermoplastic 40. The electrical component 38 is additionally stabilized by way of the thermoplastic 40. The thermoplastic 40 reaches as far as the contacts 30, these however not being encapsulated by way of the thermoplastic 40, as a result of which electrical contact is also still possible. The contact points with the circuit board 18 and the connector socket 32 are also not encapsulated with the thermoplastic 40. An enclosure 42 that surrounds the connector socket 32 at a distance is however created by way of the thermoplastic 40. In the assembled state, the enclosure 42 bears circumferentially on the mating connector 34 and stabilizes it.

The electronics 12 furthermore have a covering 44 that completely surrounds the circuit board 18. The heat sink 22 protrudes out of the covering 44, which improves heat dissipation. The connection unit 24 is surrounded at least partly by the covering 44. In this case, the covering 44 reaches as far as the enclosure 42, and as far as the contact points 30. The covering 44 is produced from a thermoset that has a comparatively low viscosity. The thermoplastic 40 ensures that the leadframes 26 are electrically isolated as far as the connector socket 32 and the contact point 28, wherein the connector socket 32 and the contacts 30 are free from the thermoplastic 40. The covering 44 reaches as far as this end, wherein the thermoplastic 40 protrudes beyond the thermoset 44. Electrical isolation is thus always provided, wherein comparatively precise creation of the connector socket 32 and contacts 30 is made possible due to the comparative ease of processing of the thermoplastic 40.

Figure 3:
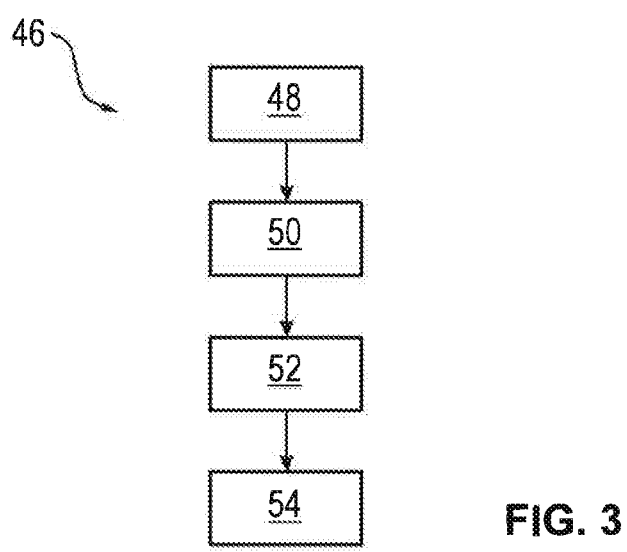
FIG. 3 shows a method for manufacturing the electronics.
Figure 4:
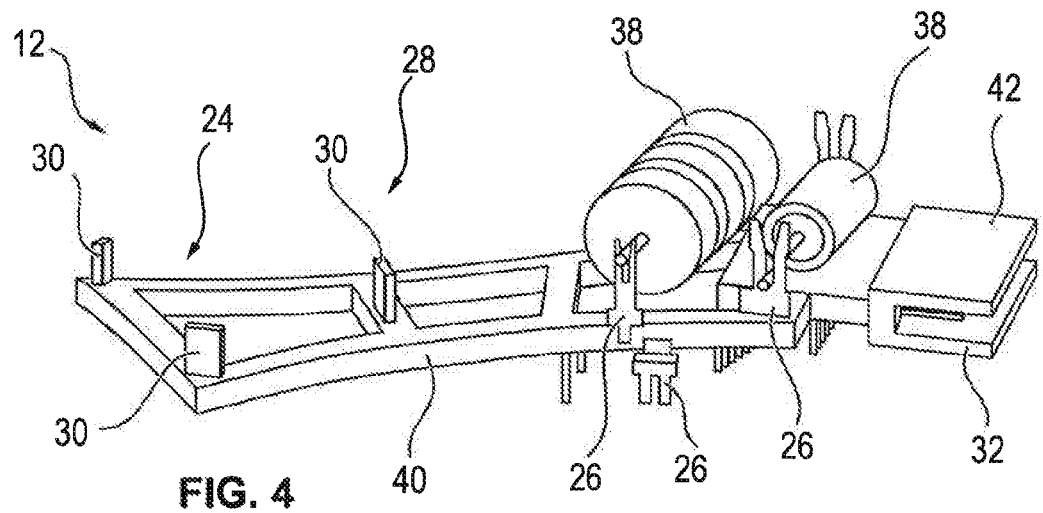
FIG. 4-6 show, in perspective, the electronics in different production stages.

FIG. 3 a method 46 for manufacturing the electronics 12. In a first working step 48, the number of leadframes 26 is provided. The leadframes 26 are punched for example out of a common metal sheet or out of different metal sheets, as a result of which the individual leadframes 26 in particular have a different thickness. The leadframes 26 are also suitably formed. At least one of the leadframes 26 has the insulation displacement contact for making electrical contact with the electrical/electronic component 38. In a subsequent second working step 50, the leadframes are arranged suitably and encapsulated with the thermoplastic 40, wherein the contact point 28, the insulation displacement contact, the connector socket 32 and the connecting points to the circuit board 18 are free from the thermoplastic 40. After the encapsulation, the electrical/electronic component 38 is placed in electrical contact with the insulation displacement contact, as a result of which the production stage, shown in perspective in FIG. 4, of the electronics 12 is reached. As an alternative thereto, the electrical/electronic component 38 is soldered to the respective leadframe 26 before the encapsulation with the thermoplastic 40. In summary, the connection unit 24 is provided, which at least partly forms the connector socket 32 for the mating connector 34 and at least partly forms the contact point 28 with the contacts 30 for the electromagnets 10 of the electric motor 4.

Figure 5:
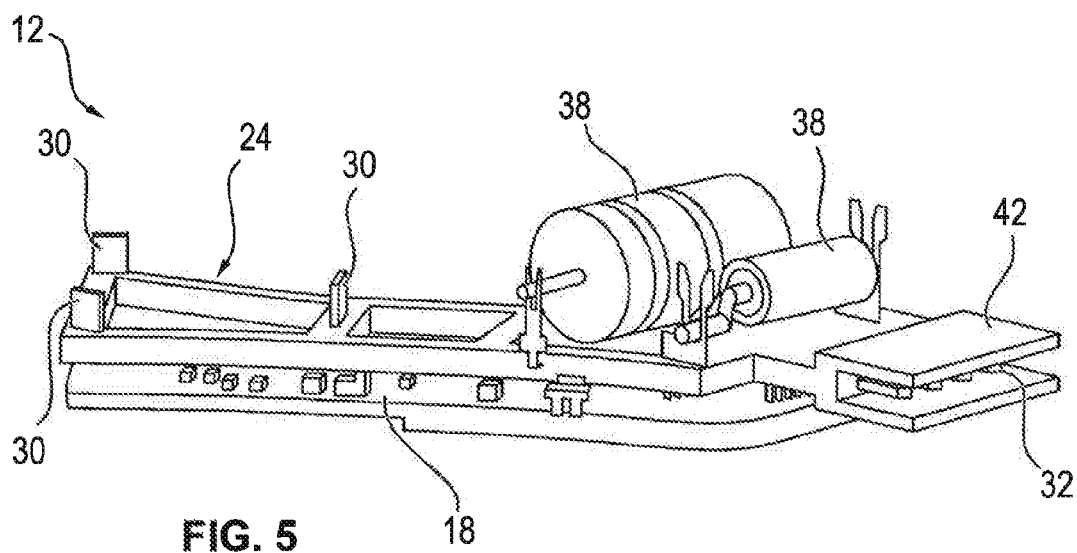

In a subsequent third working step 52, the circuit board 18 is attached to the connection unit 24 and placed in electrical contact therewith. In this case, the regions of the leadframes 26 protruding beyond the thermoplastic 40 are pressed on the circuit board 18. As an alternative or in combination therewith, the leadframes 26 are additionally soldered to the circuit board 18, as a result of which the production stage, shown in FIG. 5, of the electronics 12 is reached.

Figure 6:
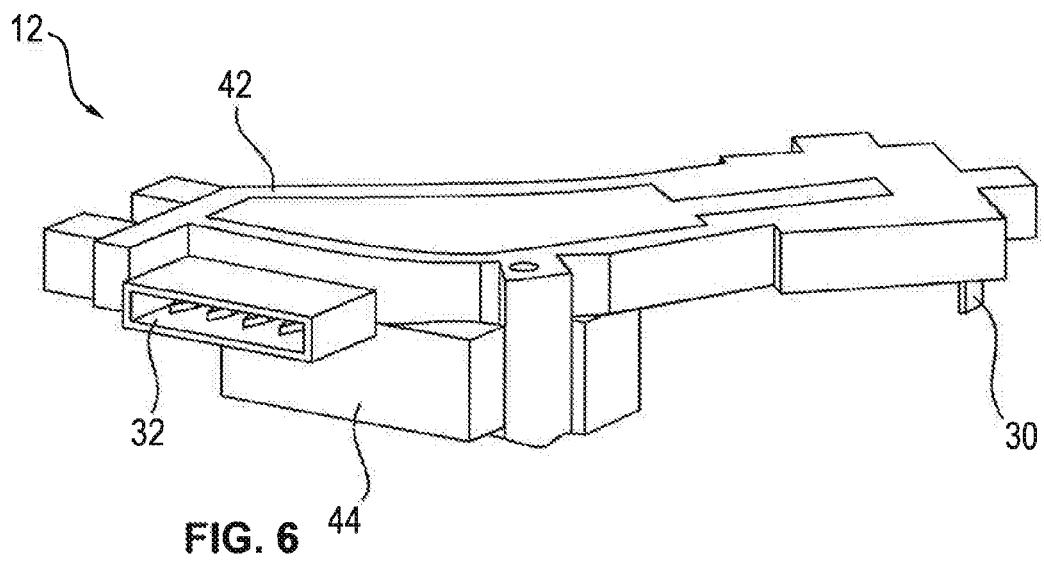

In a final fourth working step 54, the covering 44 is produced from the thermoset and the circuit board 18 is surrounded completely and the connection unit 24 is surrounded partly by the covering 44. In this case, the contacts 30 and the connector socket 32 and the enclosure 42 also still protrude from the covering 44, as shown in perspective in FIG. 6.

In summary, wiring is performed between the mating connector 34 and the circuit board 18 and between the mating connector 34 and the electrical phases 8 by way of a pre-encapsulation, namely the connection unit 24. The connection unit 24 is formed in this case by way of a plurality of leadframes 26 that are encapsulated with a thermoplastic material, namely the thermoplastic 40. Due to the comparatively high viscosity, no overmolding arises on the electrical contacts 30 of the leadframes 26. It is additionally made possible to arrange the connector socket 32 and the contacts 30 that are not surrounded by the thermoplastic 40 along or perpendicular to the parting plane of any desired position in the mold in order to create the encapsulation from the thermoplastic 40.

Following this, the circuit board 18 is connected by soldering or pressing to the pre-encapsulation, namely the connection unit 24. Following this, for example, the heat sink 22 is connected to the circuit board 18 and/or the complete assembly, that is to say in particular the circuit board 18 and partly the connection unit 24, is encapsulated with the thermoset. In this case, the region of the connector socket 32 and the contact point 28 is not encapsulated, and thus not provided with the covering 44.

In the case of the electronics 12, overmolding in the region of the contacts 30, that is to say of the phase contacts, and in the region of the connector socket 32 is not present. Essentially any desired alignment of the contact point 28 and of the connector socket 32 perpendicular to the parting plane of any mold for production of the covering 44 or for encapsulation with the thermoplastic 40 is also made possible. It is also made possible to space comparatively large components, in particular the electrical/electronic component 38, that is to say in particular the coil, from the circuit board 18, which minimizes a structural size of the circuit board 18 and makes comparatively efficient use of the given installation space.

The disclosure is not restricted to the exemplary embodiment described above. Rather, other variants of the disclosure may also be derived from these by a person skilled in the art, without departing from the subject matter of the disclosure. In particular, it is also the case that all individual features described in conjunction with the exemplary embodiment may also be combined with one another in some other way without departing from the subject matter of the disclosure.

LIST OF REFERENCE SIGNS 2 motor vehicle
4 electric motor
6 stator
8 electrical phase
10 electromagnet
11 star point
12 electronics
14 on-board power system
16 on-board computer
18 circuit board
20 electrical/electronic component
22 heat sink
24 connection unit
26 leadframe
28 contact point
30 contact
32 connector socket
34 mating connector
36 receptacle
38 electric coil
40 thermoplastic
42 enclosure
44 covering
46 method
48 first working step
50 second working step
52 third working step
54 fourth working step

What is claimed is:

1. A brushless electric motor of a motor vehicle, comprising:
a connection unit that is in electrical contact with a circuit board and attached thereto, wherein the circuit board includes a number of leadframes encapsulated by a thermoplastic material, wherein the thermoplastic material is configured to stabilize each of the leadframes with respect to one another and,
wherein the connection unit at least partly forms a connector socket for a mating connector and a contact point for an electromagnet of the electric motor; and
a covering formed of a thermoset material, the thermoset material extends to an edge of the thermoplastic material and is configured to stabilize the thermoplastic material.

2. The brushless motor vehicle of claim 1, wherein at least part of the connector socket and at least part of the contact point are formed with a common one of the leadframes.

3. The brushless electric motor of claim 1, wherein the covering completely surrounds the circuit board.

4. The brushless motor of claim 1, wherein the brushless motor includes a heat sink in thermal contact with the circuit board.

5. The brushless motor of claim 1, wherein the connection unit is soldered to and pressed on the circuit board.

6. The brushless motor of claim 1, wherein an electrical or electronic component is placed in direct electrical contact with at least one of the leadframes.

7. The brushless motor of claim 1, wherein the brushless motor includes an electromagnet that is energized in response to electronics.

8. An electric motor of a motor vehicle, comprising:
a connection unit in electrical contact with a circuit board, wherein the circuit board includes a number of leadframes encapsulated by a thermoplastic material, wherein the thermoplastic material is configured to stabilize each of the leadframes with respect to one another, wherein the connection unit includes a connector socket for a mating connector and a contact point for an electromagnet of the electric motor;
a heat sink in thermal contact with the circuit board; and
a covering produced from a thermoset material that completely surrounds the circuit board and at least partly surrounds the connection unit, wherein the thermoset material extends to an edge of the thermoplastic material and is configured to stabilize the thermoplastic material.

9. The electric motor of claim 8, wherein the electric motor is a brushless electric motor.

10. The electric motor of claim 9, wherein the circuit board is electrically isolated from other components of the motor vehicle via the thermoset material.

11. The electric motor of claim 8, wherein the connection unit is electric isolated from other components of the motor vehicle via the thermoset material.

12. The electric motor of claim 11, the connector socket and the contact point are free from the thermoset material.

13. The electric motor of claim 12, wherein the heat sink is at least partly covered with the thermoset material.

14. A method of manufacturing electronics of an electric motor of a motor vehicle, comprising:
punching out a plurality of leadframes from sheet metal;
encapsulating the plurality of leadframes with a thermoplastic;
placing a connection unit of the electric motor in electrical contact with a circuit board that has a plurality of leadframes, wherein the connection unit includes a connector socket for a mating connector and a contact point for an electromagnet of the electric motor; and
surrounding the circuit board and the connection unit via a covering produced from a thermoset material, wherein the thermoset material extends to an edge of the thermoplastic material and stabilizes the thermoplastic material.

15. The method of claim 14, wherein the method further includes stabilizing the plurality of lead frames with respect to one another such that the connection unit from the connector socket for the mating connector and at least partly forms the contact point for the electromagnet of the electric motor.

16. The method of claim 15, wherein the method further includes attaching the connection unit to the circuit board.

17. The method of claim 15, wherein electrical components are soldered to the circuit board via an SMD process.

18. The method of claim 14, wherein the method includes placing a heatsink in thermal contact with the circuit board.

19. The method of claim 14, wherein the connector socket and the contact point are free from the thermoset material.

* * * * *